United States Patent [19]

Martin

[11] Patent Number: 4,851,787

[45] Date of Patent: Jul. 25, 1989

[54] LOW NOISE FREQUENCY SYNTHESIZER

[75] Inventor: Larry R. Martin, Sebastopol, Calif.

[73] Assignee: Avantek, Inc., Milpitas, Calif.

[21] Appl. No.: 234,324

[22] Filed: Aug. 18, 1988

[51] Int. Cl.[4] .............................................. H03L 7/18
[52] U.S. Cl. ..................................... 331/1 A; 331/16; 331/25
[58] Field of Search ............................ 331/1 A, 16, 25

[56] References Cited

U.S. PATENT DOCUMENTS 4,325,031 4/1982 Ooms et al. ........................ 331/1 A Primary Examiner—David Mis
Attorney, Agent, or Firm—Limbach, Limbach & Sutton

[57] ABSTRACT

A frequency divider circuit for use in a programmable frequency synthesizer is disclosed and comprises a dual modulus prescaler, a fixed divider, a programmable counter, and a programmable fractional divider. The feedback signal is generated directly by the dual modulus prescaler, rather than by circuitry downstream from the dual modulus prescaler.

5 Claims, 3 Drawing Sheets

LOW NOISE FREQUENCY SYNTHESIZER

BACKGROUND OF THE INVENTION

1. Field of the Invention

This invention relates generally to frequency synthesizers, and relates more particularly to a novel frequency divider circuit for use in programmable frequency synthesizers.

2. Description of the Relevant Art

A programmable frequency synthesizer is a device that is capable of generating a signal having a frequency selected from within a range of frequencies. A typical programmable frequency synthesizer utilizes a digital phase-locked loop circuit that uses a voltage controlled oscillator (VCO) to generate the synthesizer output signal. The phase-locked loop includes a feedback and control loop that monitors the frequency of the synthesizer output signal, compares its frequency to that of a reference signal, and directs the VCO to adjust the frequency of the synthesizer output signal accordingly. In the feedback portion of the loop, the synthesizer output signal is divided by a digital frequency divider, which generates a feedback signal having a frequency that is a selected sub-multiple of the synthesizer output signal. The phase or frequency of the feedback signal is compared to that of a stable reference signal and the difference between the two signals defines an error signal that is filtered, amplified, and fed back to the VCO. The VCO adjusts the frequency of the synthesizer output signal in order to reduce the error signal. The reference signal has a lower frequency than the synthesizer output signal since lower frequency oscillators exhibit better long-term stability.

Frequency selection of the synthesizer output signal is provided by the programmability of the frequency divider, which divides the synthesizer output signal by a selectable divider number that is chosen to be equal to the desired frequency of the synthesizer output signal divided by the frequency of the reference signal. To change the frequency of the synthesizer output signal, one selects a different divider number. The range and step size of the discrete frequencies that a programmable frequency synthesizer can generate is determined by the range and step size of the divider numbers that can be selected.

Examples of prior art programmable frequency synthesizers are shown in FIGS. 1-3. In the programmable frequency synthesizer of FIG. 1, a voltage-controlled oscillator 10 generates the synthesizer output, $F_o$, in the range between 1000 and 1400 MHz, in 2.0 MHz steps. A frequency divider 11 is provided by two fixed dividers 12 and 14 plus a programmable divider 16. The two fixed dividers 12 and 14 serve as a divide by twenty prescaler to reduce the frequency down to the 50 to 70 MHz range, to a point where the programmable divider 16 can be built using ECL circuitry. The programmable divider 16 divides its 50 to 70 MHz input signal by an integer between 500 and 700 to generate a feedback signal, $F_f$, having a nominal frequency of 0.1 MHz. The feedback signal is compared to a reference signal, $F_r$, by a phase detector 18, which generates an error signal in proportion to the phase or frequency difference between the feedback and reference signals. The error signal is amplified and fed back to the VCO 10, which adjusts the frequency of the synthesizer output signal up or down in order to reduce the error signal.

The overall divider number for the frequency divider 11 of FIG. 1 is between 10,000 and 14,000, with a step size of 20. The divider number is equal to the product of the divide numbers of the three dividers 12, 14, and 16, namely 4*5*A, where 4 and 5 are the divide numbers of the fixed dividers 12 and 14, respectively, and A is the divide number for the programmable divider 16. A has an integer value $500 \leq A \leq 700$. The fixed portion of the frequency divider 11, dividers 12 and 14, divides by 20, while the programmable portion, divider 16, divides by a number between 500 and 700, for an overall divider number of between 10,000 and 14,000.

The phase noise performance of the programmable frequency synthesizer of FIG. 1 is limited by its high divider number and correspondingly low reference frequency. The noise floor, which is proportional to the divider number, is about 58 dBc. The programmable frequency synthesizer of FIG. 1 is limited in its phase noise performance by the large divider numbers necessary to achieve an acceptably small step size in the synthesizer output frequency. Also, switching speed is limited by the 0.1 MHz reference frequency.

The programmable frequency synthesizer illustrated in FIG. 2 improves upon the noise performance of the synthesizer of FIG. 1 by increasing the reference frequency by a factor of five without changing the effective step size. In the frequency divider 19 of FIG. 2, the fixed divider 14 and programmable divider 16 of the FIG. 1 synthesizer have been replaced by a dual modulus prescaler 20 and two programmable dividers 22 and 24. The dual modulus prescaler 20 divides the output signal from the fixed divider 12 by either of two consecutive integers, such as five or six, depending upon a control signal supplied by the programmable divider 24. The output signal from the dual modulus prescaler 20 clocks both programmable dividers 22 and 24. Programmable divider 22 divides the output signal from the dual modulus prescaler 20 by a value B, stored therein, and generates the feedback signal $F_f$ at a nominal frequency of 0.5 MHz. The value C, stored in programmable divider 24, determines how many times the dual modulus prescaler 20 will divide by six for each B number of cycles output from the dual modulus prescaler. For each B cycles, the dual modulus prescaler 20 will divide by six C times and will divide by five the remaining cycles, or B−C times. Both programmable dividers 22 and 24 include counters that are reset each B cycles by the feedback signal.

In frequency divider 19, the range of operation is determined by the values of B and C. As illustrated in FIG. 2, B is an integer $100 \leq B \leq 140$, and C is an integer $0 \leq C \leq 4$. The overall divider number, 2000 to 2800 in steps of 4, equals 4*(5*B+C) and includes a fixed divide by 4 component, provided by the fixed divider 12, and a programmable component of divide by 500 to 700 in steps of 1, provided by the dual modulus prescaler 20 and programmable dividers 22 and 24.

By way of examples, if a synthesizer output frequency of 1000 MHz is desired, then a value of B=100 is loaded into programmable divider 22 and a value of C=0 is loaded into programmable divider 24. These values yield an overall divider number of 2000 (=4*5*100), since the dual modulus prescaler 20 divides by five 100 times each 100 cycles. If the next higher synthesizer output frequency is desired, 1002 MHz, then a value of B=100 is loaded into programmable divider 22 and a value of C=1 is loaded into programmable divider 24, which causes the dual modulus prescaler 20 to divide by five 99 times out of 100 and divide by six 1 time out of 100, for an overall divider number of 2004 (=4*(5*100+1)). If the next higher synthesizer output frequency is desired, 1004 MHz, then a value of B=100 is loaded into programmable divider 22 and a value of C=2 is loaded into programmable divider 24, which causes the dual modulus prescaler 20 to divide by five 98 times out of 100 and divide by six 2 times out of 100, for an overall divider number of 2008 (=4*(5*100+2)). To obtain a synthesizer output frequency of 1010 MHz, an overall divider number of 2020 (=4*(5*101+0)) is required, which is obtained by loading a B=101 into programmable divider 22 and a C=0 into programmable divider 24. The high end of the frequency range of the synthesizer output signal is reached by loading a value of B=140 into programmable divider 22.

In comparison with the previously described programmable frequency synthesizer, the synthesizer of FIG. 2 has its noise floor improved by a factor of 5, which increases the noise floor by 14 dBc to 72 dBc. This improvement in phase noise performance is achieved without adversely effecting the frequency range and step size of the synthesizer output signal. The loop bandwidth is also increased by a factor of five, which reduces the time needed to switch the loop.

Another prior art programmable frequency synthesizer, as illustrated in FIG. 3, provides a further reduction in divider number and a corresponding improvement in phase noise by using a technique known as fractional division, which allows non-integer division by the frequency divider 25. By using fractional division, the reference frequency used in the synthesizer of FIG. 3 has been increased by a factor of twenty, with a corresponding increase in phase noise performance.

In the synthesizer of FIG. 3, the frequency divider 25 consists of fixed divider 12, dual modulus prescaler 20, a programmable divider 26, a programmable fractional divider 28, a programmable counter 30, and an OR gate 32. The dual modulus prescaler 20 divides the frequency of the output signal from the fixed divider 12 by either of two successive integers, five or six, in response to control signals generated by the programmable counter 30 and the programmable fractional divider 28 and combined by the OR gate 32. The output signal from the dual modulus prescaler 20 clocks the programmable divider 26 and the programmable counter 30. Programmable divider 26 divides the output signal from the dual modulus prescaler 20 by a value D, stored therein, and generates the feedback signal $F_f$ at a nominal frequency of 10.0 MHz. The output signal of the programmable divider 26 also supplies a clocking signal to the programmable fractional divider 28 and a reset signal to the programmable counter 30.

The programmable counter 30 is clocked by the output signal of the dual modulus prescaler 20 and supplies to the dual modulus prescaler a divide-by-six control signal at a rate proportional to the value E stored therein. The rate at which the programmable counter 30 generates the divide-by-six control signal is equal to E/D, where D is the value stored in the programmable divider 26 and E is the value stored in the programmable counter 30. For each D pulses from the dual modulus prescaler, the programmable counter 30 causes the dual modulus prescaler 20 to divide by six E times, where D is equal to either 5 or 6, and E is an integer and $0 \leq E \leq 4$. In other words, the programmable counter 30 causes the dual modulus prescaler 20 to divide by six either 0/D, 1/D, 2/D, 3/D, or 4/D of the time, depending on the value of E. The programmable counter 30 is reset each D clock pulses by the output signal from the programmable divider 26.

The programmable fractional divider 28 is clocked by the output signal of the programmable divider 26 and supplies to the dual modulus prescaler a divide-by-six control signal at a rate proportional to the value F stored therein. For each twenty pulses from the programmable divider 26, the programmable fractional divider 28 causes the dual modulus prescaler to divide by six F times, where F is an integer and $0 \leq F \leq 20$. Since the programmable fractional divider 28 is clocked at a rate equal to 1/D of the programmable counter 30, the programmable fractional divider causes the dual modulus prescaler to divide by six by a factor equal to F/20*D.

The OR gate 32 combines the two divide-by-six control signals generated by the programmable fractional divider 28 and programmable counter 30 and supplies to the dual modulus prescaler 20 a signal that determines which divisor (five or six) is used. The operation of the programmable fractional divider 28 and the programmable counter 30 are coordinated so that their control signals do not overlap.

The range in synthesizer output frequency provided by the divide by 5/6 dual modulus prescaler 20 is 20% of the lowest frequency, so to get a frequency adjustment range comparable to that of synthesizers of FIGS. 1 and 2, about 40%, the programmable divider 26 is used. The frequency divider 25 operates within two regions: (1) a lower frequency region where D=5 and the overall divider number is 100.00 to 120.00 in steps of 0.20, which results in a range of synthesizer output frequencies between 1000 and 1200 MHz in steps of 2.0 MHz; and (2) a higher frequency region where D=6 and the overall divider number is 120.00 to 140.00 in steps of 0.20, which results in a range of synthesizer output frequencies between 1200 and 1400 MHz in steps of 2.0 MHz.

The range of operation of frequency divider 25 is determined by the values of D, E, and F. As illustrated in FIG. 3, D is either 5 or 6, E is an integer $0 \leq E \leq 4$, and F is an integer $0 \leq F \leq 20$. The overall divider number equals 4*(5*D+E+F/20), or 20*D+4*E+F/5, and includes a fixed divide by 4 component, provided by the fixed divider 12, and a programmable component of divide by 25.00 to 35.00 in steps of 0.05, provided by the rest of the frequency divider circuitry. The frequency divider 25 has a divider number of 4*D*5 when the dual modulus prescaler 20 is dividing by five and 4*D*6 when the dual modulus prescaler is dividing by six. The effective, or overall, divider number is the weighted average of those two divider numbers.

By way of example, if a synthesizer output frequency of 1000 MHz is desired, then a value of D=5 is loaded into programmable divider 26, a value of F=0 is loaded into programmable fractional divider 28, and a value of E=0 is loaded in programmable counter 30. These values yield an overall divider number of 100.0, since the fixed divider 20 divides by four, the programmable divider 26 divides by five, and the dual modulus prescaler 20 divides by five all the time.

If the next higher synthesizer output frequency is desired, 1002 MHz, then a value of F=1 is loaded into programmable fractional divider 28, with D=5 and E=0, which causes the dual modulus prescaler 20 to divide by five (divider number=100) 99 times out of 100 and divide by six (divider number=120) 1 time out of 100, which works out to be an average divide number of 100.2. To obtain a synthesizer output frequency of 1040 MHz, for example, an overall divider number of 104.0 is required, which is obtained by loading F=0 into programmable fractional divider 28 and E=1 into programmable counter 30.

The upper half of the frequency range of the synthesizer output signal is reached by loading a value of D=6 into programmable divider 26. To obtain a synthesizer output frequency of 1200 MHz, an overall divider number of 120.0 is required, which is obtained by loading F=0 into programmable fractional divider 28 and E=0 into programmable counter 30. If the next higher synthesizer output frequency is desired, 1202 MHz, then a value of F=1 is loaded into programmable fractional divider 28, with D=6 and E=0, which causes the dual modulus prescaler 20 to divide by five (divider number=120) 119 times out of 120 and divide by six (divider number=144) 1 time out of 120, which works out to be an average divide number of 120.2. The maximum synthesizer output frequency of 1400 MHz is achieved by loading values of D=6, E=4, and F=20 into the corresponding dividers and counters.

In comparison to the programmable frequency synthesizer of FIG. 2, the synthesizer of FIG. 3 has its phase noise performance improved by a factor of 20, which increases the noise floor to about 98 dBc. This improvement in phase noise performance is achieved by the use of a fractional divider, with the effect of slightly changing the frequency range and step size of the synthesizer output signal, due to the operation of the programmable divider 26.

These prior art synthesizer designs show an evolution to higher reference frequencies in order to improve phase noise performance. What is needed, however, is another means for further increasing the reference frequency in order to further improve phase noise performance.

SUMMARY OF THE INVENTION

In accordance with the illustrated preferred embodiment, the present invention provides a novel frequency divider circuit for use in a programmable frequency synthesizer. The frequency divider divides the frequency of the output signal of the synthesizer by a programmable factor to provide a feedback signal having a frequency that is a selected sub-multiple of the synthesizer output signal. The frequency divider comprises a dual modulus prescaler, a fixed divider, a programmable counter, and a programmable fractional divider. The dual modulus prescaler generates the feedback signal by dividing the frequency of the synthesizer output signal in response to control signals generated by the programmable counter and programmable fractional divider, which generate their control signals in response to pre-programmed values. The fixed divider serves to generate a clocking signal for the programmable fractional divider and a reset signal for the programmable counter, both signals at a fixed submultiple of the feedback signal. The feedback signal is generated directly by the dual modulus prescaler, rather than by circuitry downstream from the dual modulus prescaler.

The feedback signal generated by the frequency divider of the present invention is a higher frequency signal than that generated by prior art frequency dividers, specifically, five times that of the FIG. 3 synthesizer, using a simpler circuit. The higher frequency of the feedback signal results in an improved phase noise performance, although the time to acquire phase lock is increased somewhat and the available frequency range is narrowed by one half, as compared to the synthesizer of FIG. 3.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENT

Figure 4:
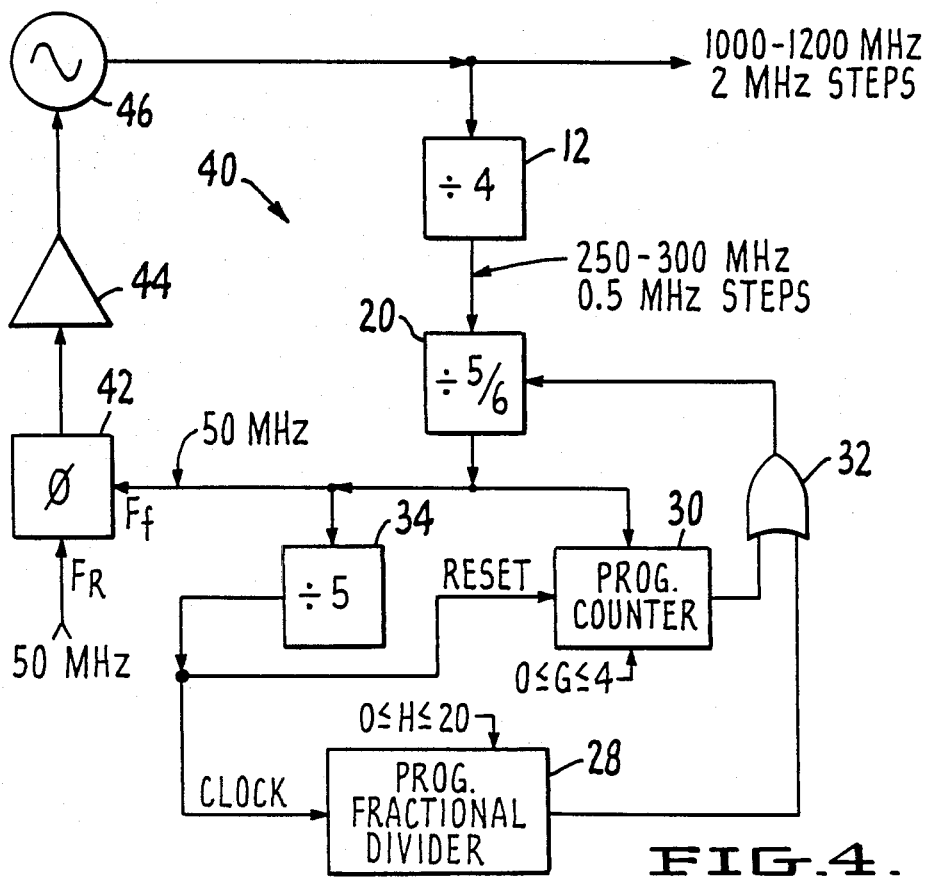
FIG. 4 is a block diagram of a programmable frequency synthesizer in accordance with the present invention.
Figure 5:
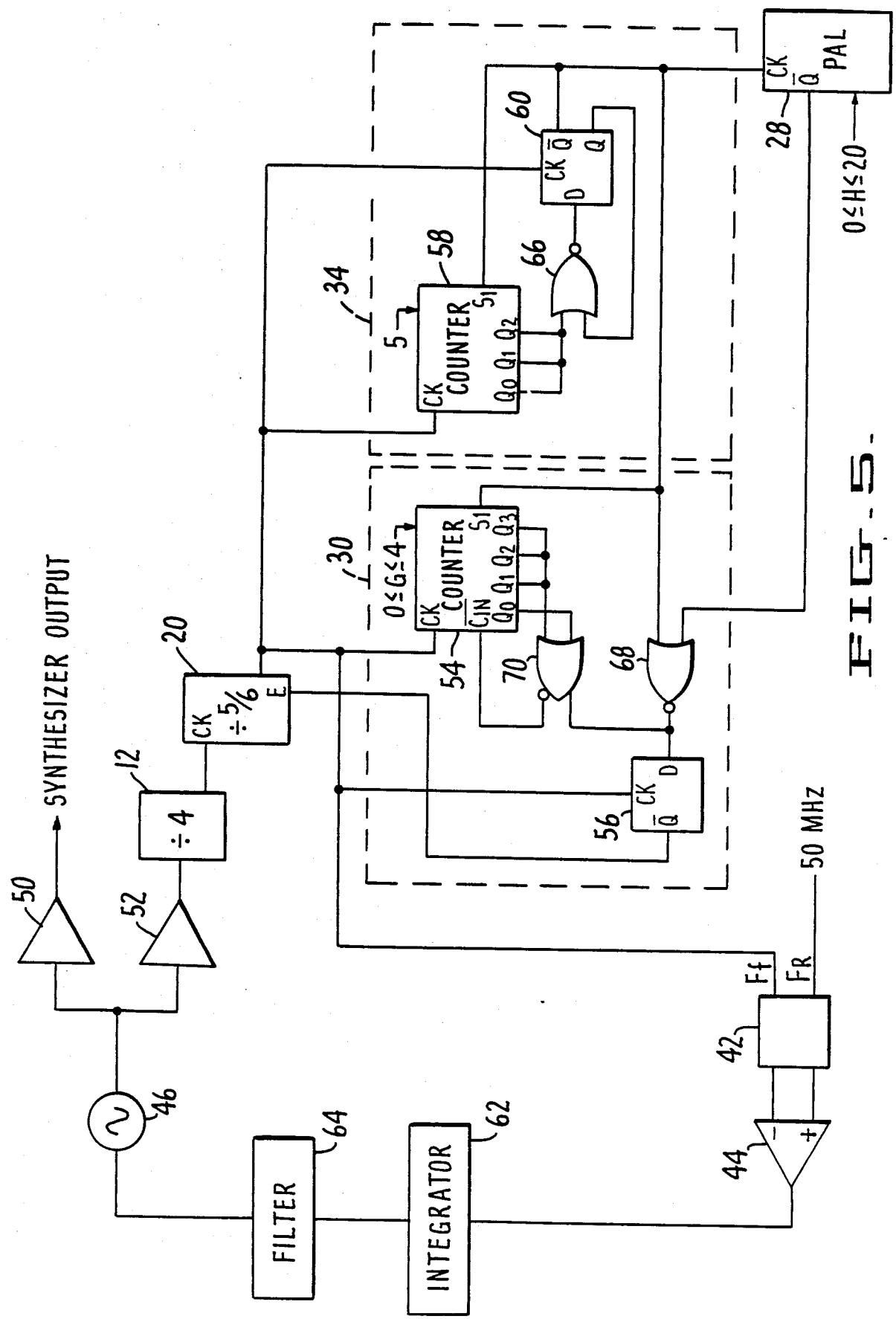
FIG. 5 is a schematic diagram of the programmable frequency synthesizer of the present invention.

FIGS. 4 and 5 of the drawings depict a preferred embodiment of the present invention for purposes of illustration only. One skilled in the art will readily recognize from the following discussion that alternative embodiments of the structures and methods illustrated herein may be employed without departing from the principles of the invention described herein.

Figure 1:
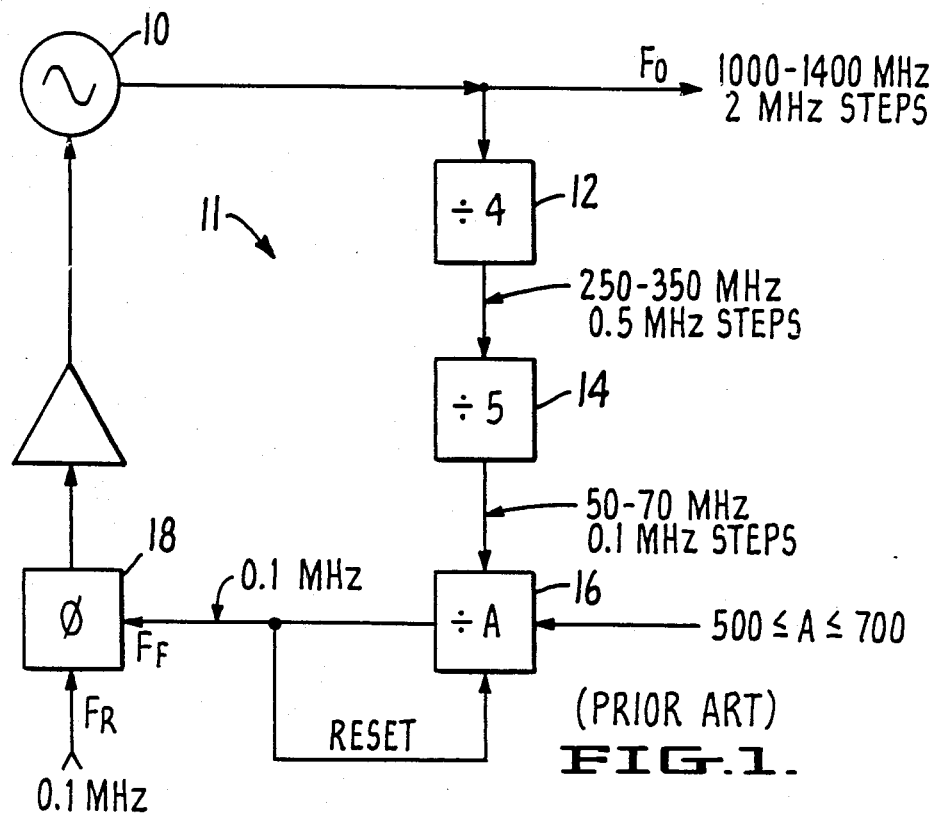
FIG. 1 is a block diagram of a prior art phase-lock-loop programmable frequency synthesizer.
Figure 2:
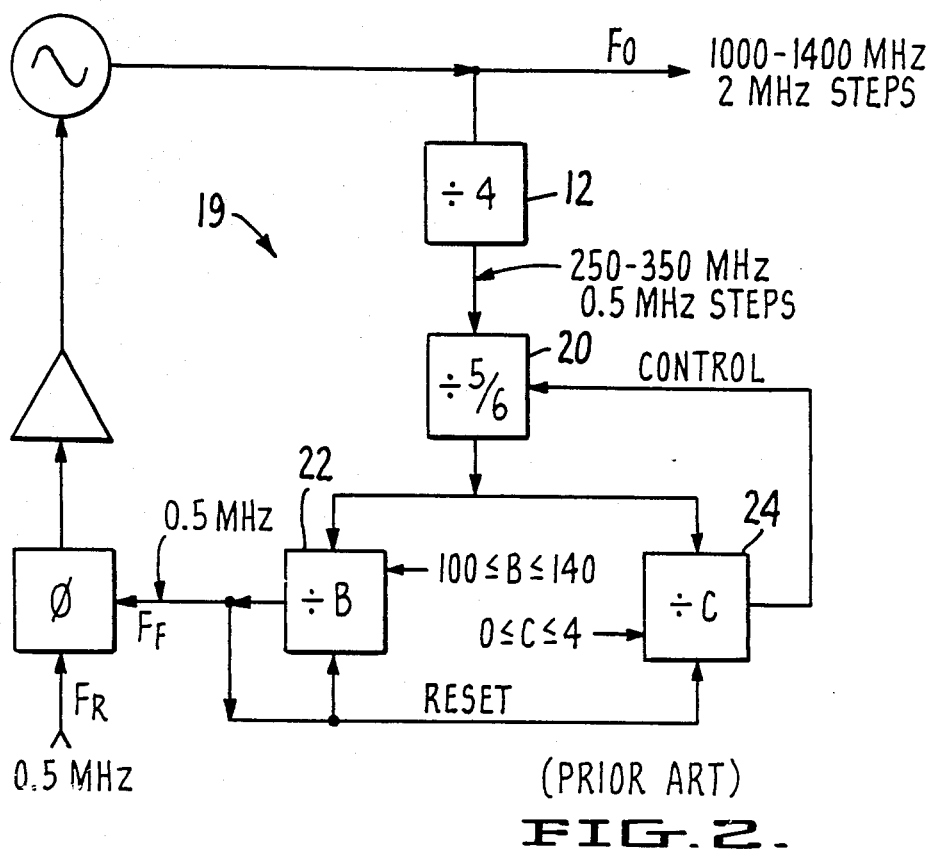
FIG. 2 is a block diagram of a prior art programmable frequency synthesizer having a dual modulus prescaler in its frequency divider.
Figure 3:
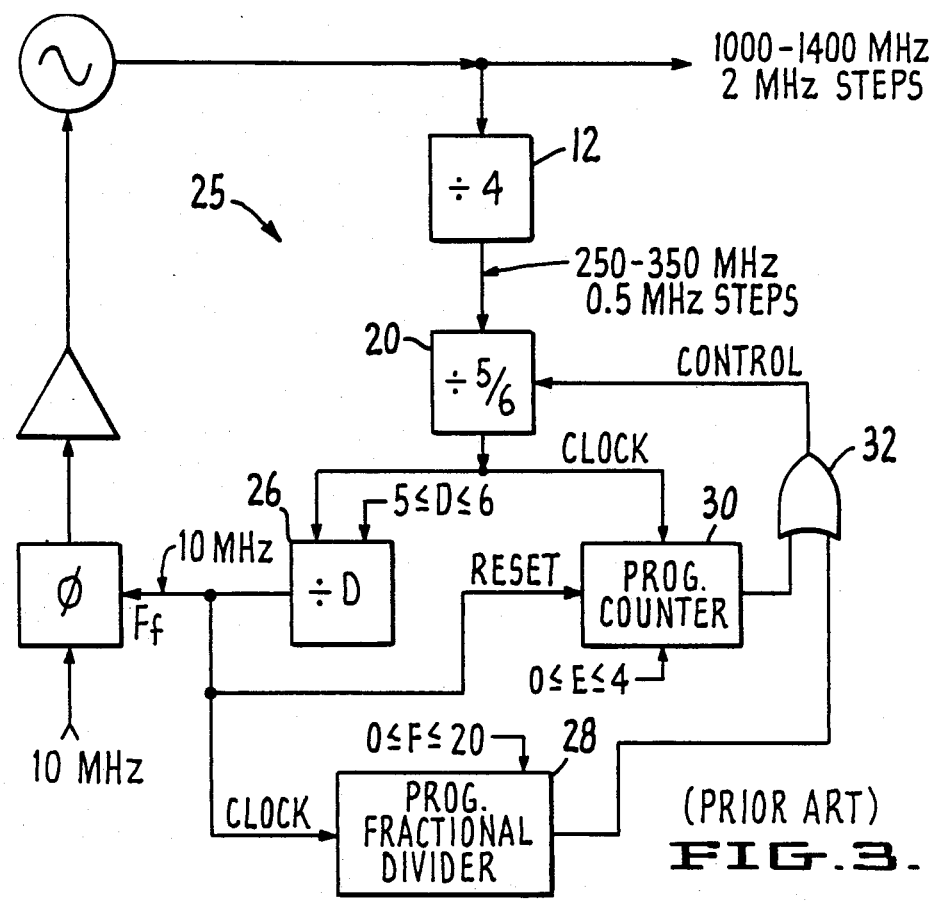
FIG. 3 is a block diagram of a prior art programmable frequency synthesizer having a fractional divider and dual modulus prescaler in its frequency divider.

The preferred embodiment of the present invention is a frequency divider circuit, including a dual modulus prescaler and programmable fractional divider, for use in a programmable frequency synthesizer. As shown in FIG. 4, a frequency divider 40 includes a fixed divider 12, dual modulus prescaler 20, fixed divider 34, programmable fractional divider 28, programmable counter 30 and OR gate 32. As in the programmable frequency synthesizers illustrated in FIGS. 1-3, the synthesizer of FIG. 4 includes, in addition to the frequency divider 40, a phase detector 42, an amplifier 44, and a voltage-controlled oscillator (VCO) 46. The two differences between the frequency divider 40 of the present invention and prior art frequency divider 25 of FIG. 3 are the generation of the feedback signal $F_f$ by the dual modulus prescaler 20 instead of the programmable divider 26, and the replacement of the programmable divider 26 by a fixed divider 34. The latter change can be accomplished by loading a fixed value into the programmable divider 26 instead of replacing it with a fixed divider.

The present invention recognizes the fact that, by restricting the frequency range to one-half that of the synthesizer of FIG. 3, the output signal of the dual modulus prescaler 20 is constant in frequency, even though the input frequency is varying. The phase detector can, thus, be moved to this point in the circuit.

By generating the feedback signal $F_f$ directly by the dual modulus prescaler 20, the frequency divider 40 increases the reference frequency by a factor of five in comparison to the prior art programmable frequency synthesizer of FIG. 3. The FIG. 3 synthesizer has a 10 MHz reference frequency and a divider number of between 100.00 to 120.00 in the lower half of its range, while the present invention has a 50 MHz reference frequency and a divider number of between 20.00 and 24.00. This factor of 5 reduction in divider number results in a 20*log(5) dBc reduction in phase noise.

In frequency divider 40, G is an integer $0 \leq G \leq 4$, and H is an integer $0 \leq H \leq 20$. The overall divider number equals $4*(5+G/5+H/100)$ and includes a fixed divide by 4 component, provided by the fixed divider 12, and a programmable component of divide by 5.00 to 6.00 in steps of 0.01, provided by the rest of the frequency divider circuitry. The frequency divider 40 has a divider number of 20.0 when the dual modulus prescaler 20 is dividing by five and 24.0 when the dual modulus prescaler is dividing by six. For each 100 cycles of the output signal from the dual modulus prescaler, it divides by six 20G+H number of times and divides by five the remaining 100−(20G+H) number of times.

A negative effect o this change is that this loop now acquires lock more slowly than the prior loop. The reason for this is that the loop acquisition speed is inversely proportional to the divider number, assuming the same loop bandwidth. As the divider number is now reduced, the time to acquire lock is increased from about 200 micro-seconds to about 1 milli-second. The increase in time to acquire lock is of little importance in some synthesizers, such as YIG based synthesizers, since the settling time of the YIG is the major tuning speed limitation.

The programmable frequency synthesizer of the present invention is shown in schematic form in FIG. 5. The voltage controlled oscillator 46 generates the synthesizer output signal through one amplifier 50 and drives the divide by 4 fixed divider 12 through another amplifier 52. The output signal of the fixed divider 12 clocks the dual modulus prescaler 20. The output signal from the dual modulus prescaler 20 clocks a counter 54 and a D flip-flop 56 in the programmable counter 30, clocks a counter 58 and a D flip-flop 60 in the fixed divider 34, and supplies the feedback signal $F_f$ to the phase detector 42. A 50 MHz reference signal $F_r$ is also supplied to the phase detector, which generates an error signal that is amplified by amplifier 44, integrated and filtered by integrator 62 and filter 64, respectively, and is supplied to the VCO 46.

The fixed divider 34 includes the counter 58, flip-flop 60, and a NOR gate 66. The $Q_0$, $Q_1$, and $Q_2$ outputs of the counter 58 are connected as a wired-OR to one input terminal of the NOR gate 66, while the other input terminal of NOR gate 66 is connected to the Q output terminal of the D flip-flop 60. The output port of the NOR gate 66 is connected to the D input terminal of the flip-flop 60. The $\overline{Q}$ output terminal of the D flip-flop 60 is connected to the $S_1$ input terminal of the counter 58, in addition to being connected to the clock input of the programmable fractional divider 28 and an input of another NOR gate 68. Counter 58 is configured as a down counter that supplies to the NOR gate 66 a logic one signal as it is counting down from five toward zero. As long as the counter output is non-zero, the NOR gate supplies a logic zero to the flip-flop, which generates a logic one at its $\overline{Q}$ output terminal. When the counter hits zero, the counter supplies a logic zero to the NOR gate 66, which in response generates a logic one to the flip-flop, which in turn generates a logic zero at its $\overline{Q}$ output terminal. The signal from the $\overline{Q}$ output terminal acts to reload the counter 58 with a value of five and clock the programmable fractional divider 28. Since the output signal from the dual modulus prescaler 20 is nominally 50 MHz and since the value loaded into the counter is equal to five, the output signal from the $\overline{Q}$ output terminal of flip-flop 60 is nominally 10 MHz. The divider 34 as shown in FIG. 5 is configured for use as the programmable divider 26 of the FIG. 3 synthesizer; alternatively, a simple divide-by-five counter could be used.

The $\overline{Q}$ output signal from flip-flop 60 also acts as a clock for the programmable fractional divider 28. For every twenty input pulses of this nominally 10 MHz clock signal, the programmable fractional divider generates H pulses, where $0 \leq H \leq 20$. The programmable fractional divider 28 can be implemented as a PAL device. The $\overline{Q}$ output signal from the programmable fractional divider is also connected to the NOR gate 68. The output terminal of NOR gate 68 is connected to the D input terminal of flip-flop 56, which has its $\overline{Q}$ output terminal connected to the divide by five/six control terminal of the dual modulus prescaler 20. When the programmable fractional divider 28 generates an output pulse every H/20 cycles of the 10 MHz clock signal, the NOR gate 68 and flip-flop 56 allow the pulse to pass through to the control input of the dual modulus prescaler 20.

The divide-by-six control signal generated by the programmable counter 30 also passed through the flip-flop 56 to the control input of the dual modulus prescaler 20. The counter 54 is also configured as a down counter. A value of G, where $0 \leq G \leq 4$, is loaded into the counter 54 every fifth cycle of the nominally 50 MHz output signal of the dual modulus prescaler 20 by the 10 Mhz signal generated at the $\overline{Q}$ output terminal of flip-flop 60. The $Q_0$ input of counter 54 is connected to one input terminal of another NOR gate 70 and the $Q_1$, $Q_2$, and $Q_3$ output terminals of the counter are connected as a wired-OR to the other input terminal of the NOR gate. The NOR gate 70 generates a logic one pulse once for each non-zero count of the counter 54. If, for example, a value of G=2 is loaded into the counter, then the NOR gate would generate two logic one pulses followed by three logic zero pulses for each five clock pulses from the dual modulus prescaler 20. An inverting output terminal of the NOR gate 70 is coupled to the $\overline{C_{in}}$ terminal of the counter 54 so that the counter halts when it reaches zero. The non-inverting output terminal of the NOR gate 70 is connected to the D input terminal of the flip-flop 56, which, at the appropriate time, passes the divide-by-six control signal to the dual modulus prescaler 20.

The following Motorola products are preferred for implementing the circuitry of the synthesizer of the present invention: MC12040—phase detector 42; MC10137—counters 54 and 58; MC10231—D flip-flops 56 and 60; MC10102—NOR gates 66, 68, and 70; MC12009—dual modulus prescaler 20. In addition, the fixed divider 12 is preferably a Plessy SP8611, and the programmable fractional divider 28 is implemented as a programmed PAL, model EP310 from Altera.

It should be pointed out that greater frequency ranges can be accommodated by this technique if multiple reference frequencies are present. Thus, an octave in frequency coverage could result with as few as four selected different reference frequencies, each a multiple of 1.2 times the next lower frequency, when the dual modulus prescaler is a divide by 5/6.

From the above description, it will be apparent that the invention disclosed herein provides a novel and advantageous frequency divider circuit for use in a programmable frequency synthesizer. The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

What is claimed is:

1. In a programmable frequency synthesizer having a voltage controlled oscillator, a frequency divider, and a phase detector, wherein the voltage controlled oscillator generates a synthesizer output signal in response to an error signal, wherein the frequency divider generates a feedback signal having a frequency that is a selected sub-multiple of the synthesizer output signal, wherein the phase detector generates the error signal in proportion to the difference in phase between the feedback and reference signals, wherein the digital frequency divider includes a dual modulus prescaler, a programmable divider, a programmable counter, and a programmable fractional divider, wherein the dual modulus prescaler divides the frequency of the synthesizer output signal by either of two successive integers in response to first and second control signals, wherein the programmable divider divides the output signal of the dual modulus prescaler to provide a clocking signal to the programmable fractional divider and a reset signal to the programmable counter, wherein the programmable counter is clocked by the output signal of the dual modulus prescaler and generates the first control signal at a first fractional rate proportional to a first pre-selected value entered therein, wherein the programmable fractional divider is clocked by the output signal of the programmable divider and generates the second control signal at a second fractional rate proportional to a second pre-selected value entered therein, wherein the improvement comprises:
    loading a constant value into the programmable divider so that the output signal of the programmable divider is a fixed sub-multiple of the feedback signal; and
    connecting the output signal from the dual modulus prescaler to the phase detector for use as the feedback signal.

2. A digital frequency divider for use with a programmable frequency synthesizer, wherein the digital frequency divider is operable for dividing the frequency of an output signal of the synthesizer by a programmable factor to provide a feedback signal having a frequency that is a selected sub-multiple of the synthesizer output signal, the divider comprising:
    a dual modulus prescaler operable for generating the feedback signal by digitally dividing the frequency of a signal corresponding to the synthesizer output signal by either of two successive integers in response to first and second control signals respectively provided by a programmable counter and a programmable fractional divider;
    a fixed divider coupled to the dual modulus prescaler and operable for digitally dividing the frequency of the feedback signal by a fixed factor to provide a clocking signal to the programmable fractional divider and a reset signal to the programmable counter;
    a programmable counter coupled to the dual modulus prescaler and the fixed divider and clocked by the feedback signal and operable or supplying to the dual modulus prescaler a first control signal that causes the dual modulus prescaler to divide by one of the two successive integers at a first fractional rate of the feedback signal as determined by a first pre-selected value stored in the programmable counter; and
    a programmable fractional divider coupled to the fixed divider and clocked by the output signal of the fixed divider and operable for supplying to the dual modulus prescaler a second control signal that causes the dual modulus prescaler to divide by one of the two successive integers at a second fractional rate of the feedback signal as determined by a second pre-selected value stored in the programmable fractional divider and the fixed factor of the fixed divider.

3. A digital frequency divider for use with a phase-locked loop, wherein said digital frequency divider is operable for dividing the frequency of an output signal of the synthesizer by a programmable factor to provide a feedback signal having a frequency that is a selected sub-multiple of tee synthesizer output signal, said divider comprising:
    a dual modulus prescaler operable for generating said feedback signal by digitally dividing the frequency of the synthesizer output signal by either of two successive integers;
    a fixed divider coupled to the dual modulus prescaler and operable for digitally dividing the frequency of said feedback signal by a fixed factor to provide a timing signal;
    control means responsive to said timing signal for controlling said dual modulus prescaler to divide said synthesizer output signal by one of said integers a selected fraction of the time and divide by the other integer the remainder of the time.

4. A programmable frequency synthesizer comprising:
    a voltage controlled oscillator operable for generating a synthesizer output signal and for varying the frequency of said synthesizer output signal in response to an error signal;
    a digital frequency divider coupled to the voltage controlled oscillator and operable for digitally dividing the frequency of the synthesizer output signal by a programmable factor to provide a feedback signal having a frequency that is a selected sub-multiple of the synthesizer output signal; and
    a phase detector coupled between the digital frequency divider and the voltage controlled oscillator and operable for comparing the feedback signal to a reference frequency signal and for generating the error signal in proportion to the difference in phase between the feedback and reference signals;
    wherein the digital frequency divider includes a dual modulus prescaler, a fixed divider coupled to the dual modulus prescaler, a programmable counter coupled to the dual modulus prescaler and the fixed divider, and a programmable fractional divider coupled to the fixed divider, wherein the dual modulus prescaler is operable for generating the feedback signal by dividing the frequency of the synthesizer output signal by either of two successive integers in response to first and second control signals provided respectively by the programmable counter and the programmable fractional divider, wherein the fixed divider is operable for dividing the output signal of the dual modulus prescaler by a fixed factor to provide a reset signal to the programmable counter and a clocking signal to the programmable fractional divider, wherein the programmable counter is clocked by the feedback signal and is operable for supplying to the dual modulus prescaler a first control signal that causes the dual modulus prescaler to divide by one of the two successive integers at a first fractional rate of the feedback signal as determined by a first preselected value stored in the programmable counter, and wherein the programmable fractional divider is clocked by the output signal of the fixed divider and is operable for supplying to the dual modulus prescaler a second control signal that causes the dual modulus prescaler to divide by one of the two successive integers at a second fractional rate of the feedback signal as determined by a second preselected value stored in the programmable fractional divider and the fixed factor of the fixed divider.

5. A digital frequency divider for use with a programmable frequency synthesizer, wherein the digital frequency divider is operable for dividing the frequency of an output signal of the synthesizer by a programmable factor to provide a feedback signal having a frequency that is a selected sub-multiple of the synthesizer output signal, the divider comprising:

dual modulus prescaler means for generating the feedback signal by digitally dividing the frequency of the synthesizer output signal by either of two successive integers in response to first and second control signals respectively provided by a programmable counter and a programmable fractional divider;

fixed divider means for digitally dividing the frequency of the feedback signal by a fixed factor to provide a clocking signal to the programmable fractional divider and a reset signal to the programmable counter;

programmable counter means clocked by the feedback signal for supplying to the dual modulus prescaler a first control signal that causes the dual modulus prescaler to divide by one of the two successive integers at a first fractional rate of the feedback signal as determined by a first pre-selected value stored in the programmable counter; and programmable fractional divider means clocked by the output signal of the fixed divider for supplying to the dual modulus prescaler a second control signal that causes the dual modulus prescaler to divide by one of the two successive integers at a second fractional rate of the feedback signal as determined by a second preselected value stored in the programmable fractional divider and the fixed factor of the fixed divider.

* * * * *